(12) United States Patent
Konishi (10) Patent No.: US 11,852,677 B2
(45) Date of Patent: Dec. 26, 2023

(54) TEST SYSTEM (71) Applicant: Tokyo Electron Limited, Tokyo (JP)

(72) Inventor: Kentaro Konishi, Yamanashi (JP)

(73) Assignee: Tokyo Electron Limited, Tokyo (JP)

( * ) Notice: Subject to any disclaimer, the term of this patent is extended or adjusted under 35 U.S.C. 154(b) by 60 days.

(21) Appl. No.: 17/753,222

(22) PCT Filed: Aug. 28, 2020

(86) PCT No.: PCT/JP2020/032766
§ 371 (c)(1),
(2) Date: Feb. 24, 2022

(87) PCT Pub. No.: WO2021/049336
PCT Pub. Date: Mar. 18, 2021

(65) Prior Publication Data
US 2022/0276298 A1 Sep. 1, 2022

(30) Foreign Application Priority Data
Sep. 9, 2019 (JP) .................................. 2019-164007

(51) Int. Cl.
*G01R 31/28* (2006.01)
(52) U.S. Cl.
CPC ..... *G01R 31/2875* (2013.01); *G01R 31/2862* (2013.01)

(58) Field of Classification Search
CPC ............ G01R 31/2877; G01R 31/2875; G01R 31/2874; G01R 31/2856
See application file for complete search history.

(56) References Cited

U.S. PATENT DOCUMENTS 6,204,679 B1 * 3/2001 Gray, III ................ G11C 29/56
324/750.08
2019/0041454 A1 * 2/2019 Akiyama ............ G01R 31/2881

FOREIGN PATENT DOCUMENTS

| JP | 2010-127600 | 6/2010 |
|---|---|---|
| JP | 2018-534565 | 11/2018 |
| JP | 2019-029627 | 2/2019 |
| JP | 2019-149500 | 9/2019 |
| WO | 2017/075557 | 5/2017 |
| WO | 2018/235411 | 12/2018 |

* cited by examiner

*Primary Examiner* — Tung X Nguyen
(74) *Attorney, Agent, or Firm* — IPUSA, PLLC (57) ABSTRACT

A test system that is compatible with multiple specifications while maintaining a footprint is provided. The test system includes a plurality of test chambers, each test chamber of the plurality of test chambers including a test head used when a substrate on a stage is tested, and a heating medium supply configured to supply a heating medium to the stage. The heating medium supply is disposed in an area lower than a test area in which the plurality of test chambers are disposed.

6 Claims, 9 Drawing Sheets

TEST SYSTEM

TECHNICAL FIELD

The present disclosure relates to a test system.

BACKGROUND

A test system, in which a wafer on which a semiconductor device is formed is mounted on a stage and the current is supplied to the semiconductor device from a tester through a probe or the like to test the electrical characteristics of the semiconductor device, is known.

Patent Document 1 discloses a test system including a system body including multiple test chambers accommodating test units that test an object to be tested on a stage, and a refrigerant supply that supplies refrigerant to the stage. Additionally, it is illustrated that the refrigerant supply is disposed outside of the system body.

CITATION LIST

Patent Document

[Patent Document 1] Japanese Laid-Open Patent Application Publication No. 2019-29627

SUMMARY

Problem to be Solved by the Invention

In one aspect, the present disclosure provides a test system that is compatible with multiple specifications while maintaining a footprint.

Means for Solving Problem

In order to solve the above-described problem, according to one aspect, a test system including multiple test chambers, each test chamber of which includes a test head used when a substrate on a stage is tested, and a heating medium supply configured to supply a heating medium to the stage, the heating medium supply being disposed in a lower area of a test area in which the multiple test chambers are located is provided.

Effect of Invention

According to one aspect, a test system that is compatible with multiple specifications while maintaining a footprint can be provided.

DESCRIPTION OF EMBODIMENTS

In the following, embodiments for carrying out the present disclosure will be described with reference to the drawings. In each drawing, the same components are referenced by the same reference numerals and overlapping descriptions may be omitted.

<Test System>

Figure 1:
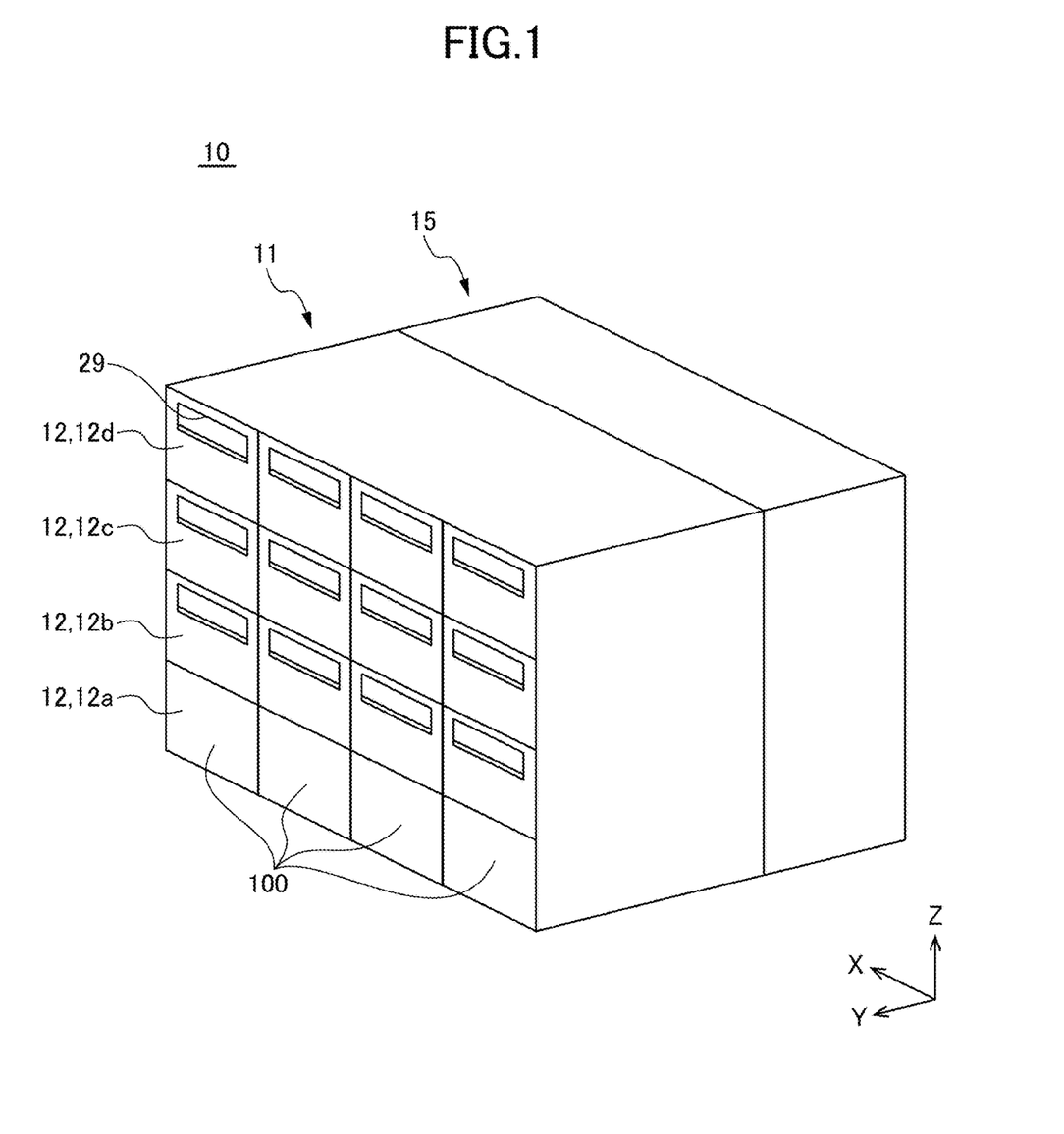
FIG. 1 is an example of a perspective view schematically explaining a configuration of a test system in accordance with a present embodiment.

A test system 10 according to the present embodiment will be described with reference to FIG. 1. FIG. 1 is an example of a perspective view schematically explaining a configuration of the test system 10 according to the present embodiment. In the following description, a direction in which cells 12 are arranged will be described as the X direction, a longitudinal direction of the cell 12 will be described as the Y direction, and a height direction will be described as the Z direction.

The test system 10 includes a cell tower 11 and a loader 15.

The cell tower 11 has a cuboid shape and multiple partitioned cells 12 are arranged in multiple stages, e.g., 4 rows and 4 stages. A temperature control module 100, which will be described later, is disposed in a cell 12a at the lowest stage among the multiple cells 12. Cells 12b to 12d that are cells at the second stage and higher among the multiple cells 12 are test chambers that test wafers W (see FIG. 2A and FIG. 2B, which will be described later). That is, the temperature control module 100 is disposed in an area lower than a test area in which the multiple test chambers are located. In the example illustrated in FIG. 1, a case in which four temperature control modules 100 are disposed is illustrated in the example. However, the embodiment is not limited thereto, and one or more temperature control modules 100 may be disposed. Additionally, each cell 12a preferably has the same shape, and each of the four temperature control modules 100 preferably has the same shape.

Additionally, the cells 12a and the cells 12b to 12d preferably have the same shape. Further, among the cells 12a at the lowermost stage, a cell in which the temperature control module 100 is not disposed may be used as the test chamber.

The loader 15 has a cuboid shape and is disposed adjacent to the cell tower 11. The loader 15 has a transfer mechanism (which is not illustrated), and transfers a wafer W into each of the cells 12b to 12d that are the test chambers and transfers the wafer W from each of the cells 12b to 12d to the outside.

Figure 2A:
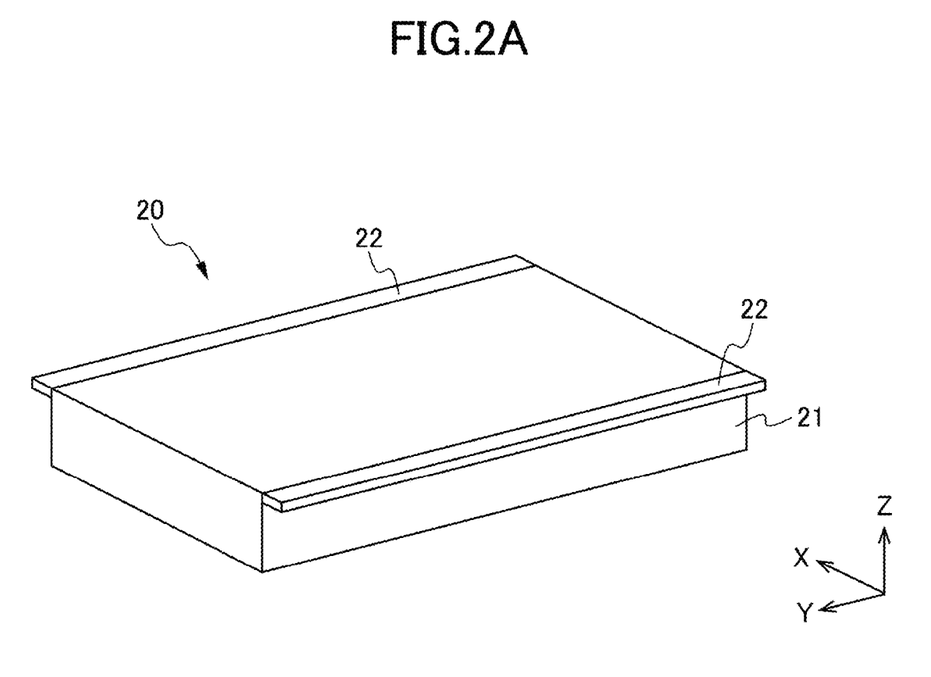
FIG. 2A is an example of a perspective view of a test head.
Figure 2B:
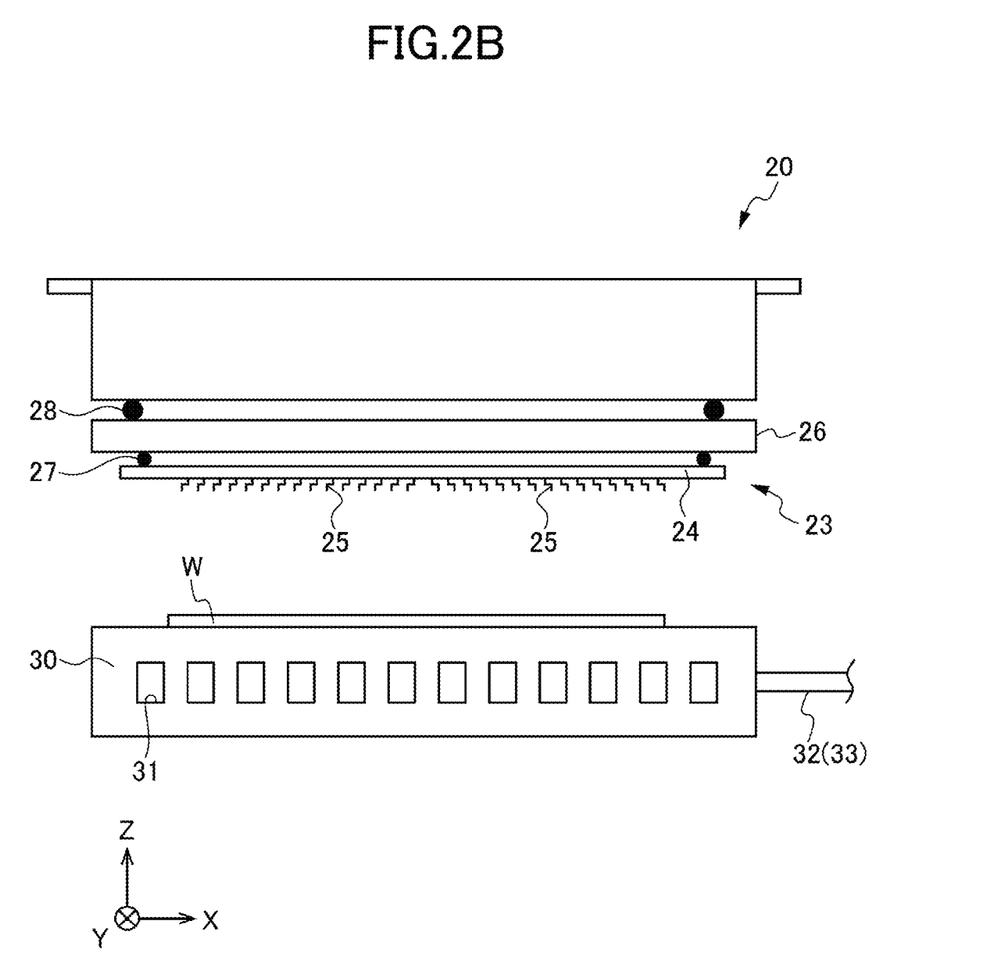
FIG. 2B is an example of a front view illustrating an arrangement of the test head, a pogo frame, and a probe card in a test chamber.

FIG. 2A and FIG. 2B are examples of a diagram illustrating components inside the test chamber. FIG. 2A is an example of a perspective view of a test head 20. FIG. 2B is an example of a front view illustrating an arrangement of the test head 20, a pogo frame 26, and a probe card 23 in the test chamber.

As illustrated in FIG. 2A, the test head 20 includes a body 21 formed of a housing having a cuboid shape and flanges 22 projecting laterally from upper portions of side surfaces of the body 21 in the longitudinal direction (the Y direction). The body 21 accommodates a main board (which is not illustrated) that is a test circuit.

As illustrated in FIG. 2B, the cell 12 that is the test chamber includes the test head 20, the probe card 23, and the pogo frame 26 holding a pogo pin (which is not illustrated) that electrically couples the probe card 23 and the main board of the test head 20. Seal members 27 are disposed between the probe card 23 and the pogo frame 26, and seal members 28 are disposed between the pogo frame 26 and the test head 20. The space surrounded by the seal members 27 and 28 is decompressed, so that the probe card 23 and the pogo frame 26 are attached to the test head 20 by vacuum suction.

The probe card 23 includes a body 24 having a disc shape and multiple contact probes 25 that are multiple columnar contact terminals arranged to project downwardly from a lower surface of the body 24 in the drawing. Each contact probe 25 contacts an electrode pad or solder bump (which are not illustrated) of each semiconductor device formed on the wafer W when the wafer W is in contact with the probe card 23.

A position of a stage 30, on which the wafer W is mounted, is adjusted with an aligner (which is not illustrated) in a rotational direction using the X, Y, and Z directions as the rotational axes. Additionally, the stage 30 is moved up and down by a lifting mechanism (which is not illustrated). This causes the wafer W mounted on the stage 30 to come into contact with the probe card 23.

Additionally, a flow path 31, through which a heating medium such as brine flows, is formed in the stage 30 on which the wafer W is mounted. One end of piping 32 is connected to one end of the flow path 31. The other end of the piping 32 is connected to the temperature control module 100. One end of piping 33 is connected to the other end of the flow path 31. The other end of the piping 33 is connected to the temperature control module 100. This allows the heating medium to circulate between the temperature control module 100 and the flow path 31 through the piping 32 and the piping 33. As described, the temperature of the wafer W during testing is controlled by supplying, to the flow path 31 of the stage 30, the heating medium whose temperature is adjusted by the temperature control module 100.

Referring back to FIG. 1, a maintenance opening 29 is provided on the external side of each cell 12 that serves as the test chamber.

Figure 3A:
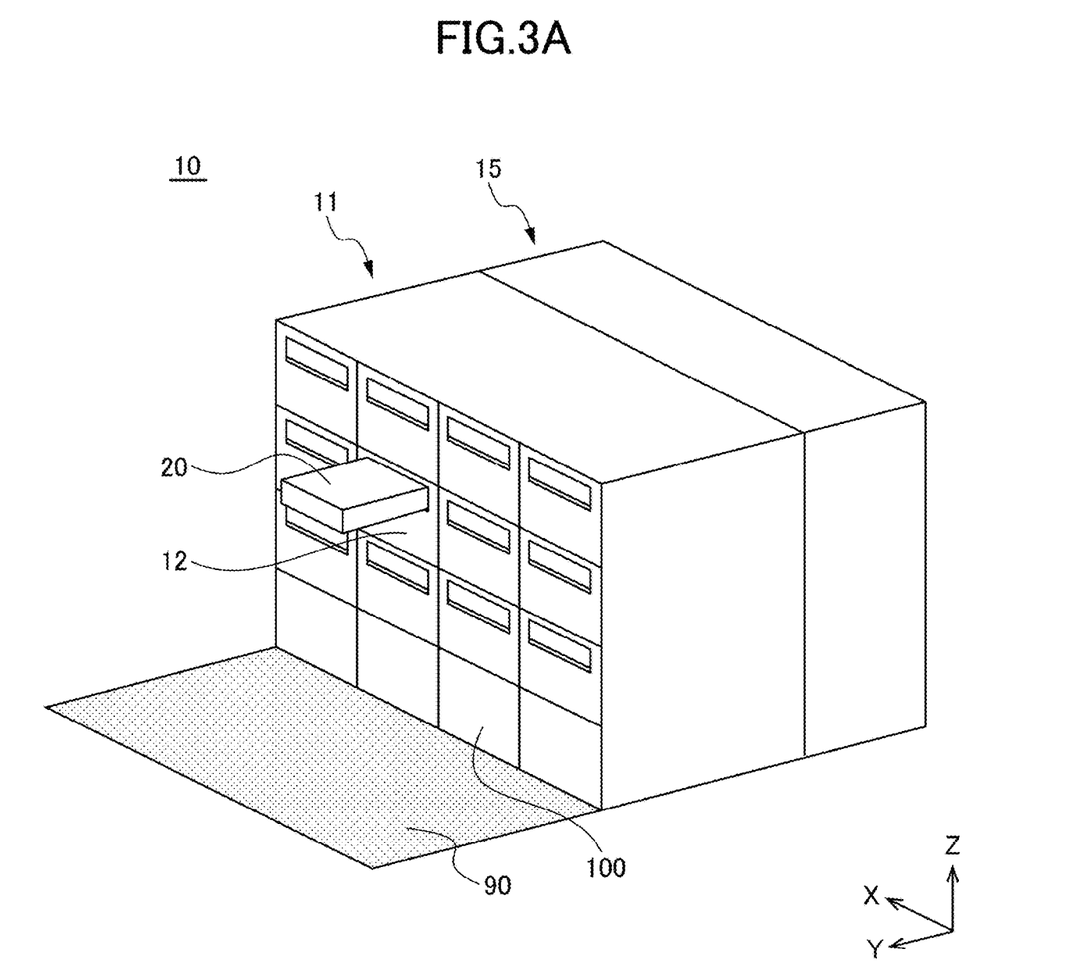
FIG. 3A is an example of a perspective view of the test head during maintenance.
Figure 3B:
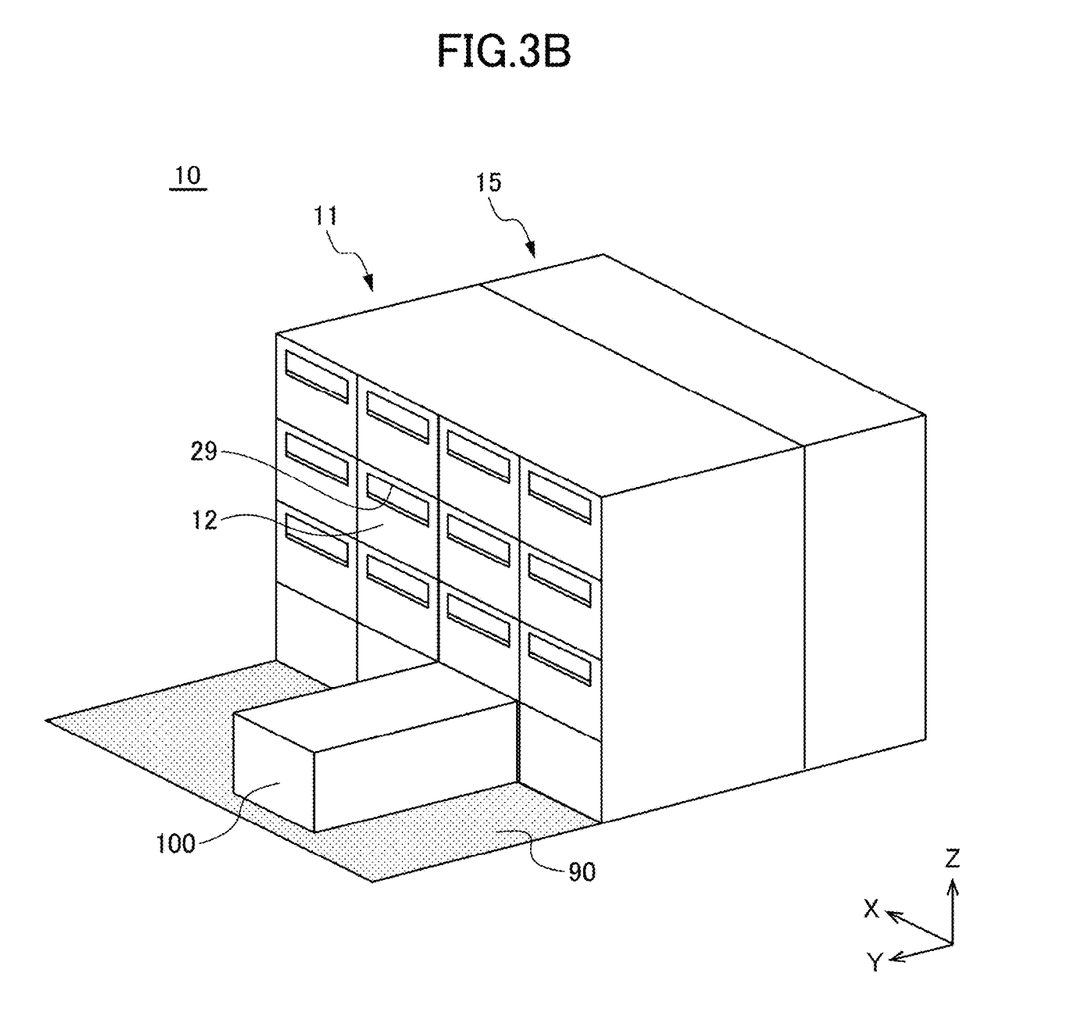
FIG. 3B is an example of a perspective view of a temperature control module during maintenance.

FIG. 3A and FIG. 3B are examples of a perspective view for explaining maintenance of the test system 10. FIG. 3A is an example of a perspective view of the test head 20 during maintenance. FIG. 3B is an example of a perspective view of the temperature control module 100 during maintenance.

As illustrated in FIG. 3A and FIG. 3B, on a side of the cell tower 11 that is opposite to a surface adjacent to the loader 15 (hereinafter, referred to as "the external side"), a maintenance area 90 is prepared to allow an operator to perform maintenance work on each cell 12.

As illustrated in FIG. 3A, when the test head 20 is maintained or the like, the test head 20 is drawn into the maintenance area 90 through the maintenance opening 29. Here, the test head 20 is supported by a slide rail (which is not illustrated) disposed in the cell 12 along the longitudinal direction (Y direction) of the test head 20 through the flange 22 and is configured be drawn in the longitudinal direction by multiple ball bases disposed on the upper surface of the slide rail. The operator can remove a consumed main board from the test head 20 that is drawn and install a new main board. A support mechanism (which is not illustrated) that supports the drawn test head 20 may be provided for the operator to easily replace the main board.

As illustrated in FIG. 3B, when the temperature control module 100 is maintained or the like, the temperature control module 100 is drawn into the maintenance area 90. The operator can maintain the temperature control module 100 that is drawn. Ad described, the maintenance area 90 for maintaining the temperature control module 100 may be shared with the maintenance area 90 for maintaining the test head 20. Thus, the increase in the area occupied by the entire test system 10 can be suppressed.

Next, an example configuration of the temperature control module 100 in the test system 10 will be described with reference to FIGS. 4 to 6.

First Example

Figure 4A:
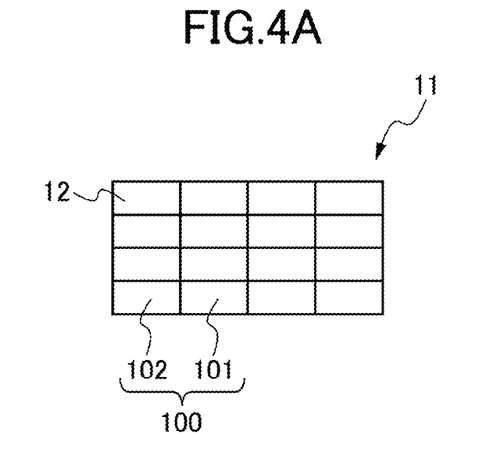
FIG. 4A is an example of an arrangement of a temperature control module 100 disposed in a cell tower in a test system according to a first embodiment.
Figure 4B:
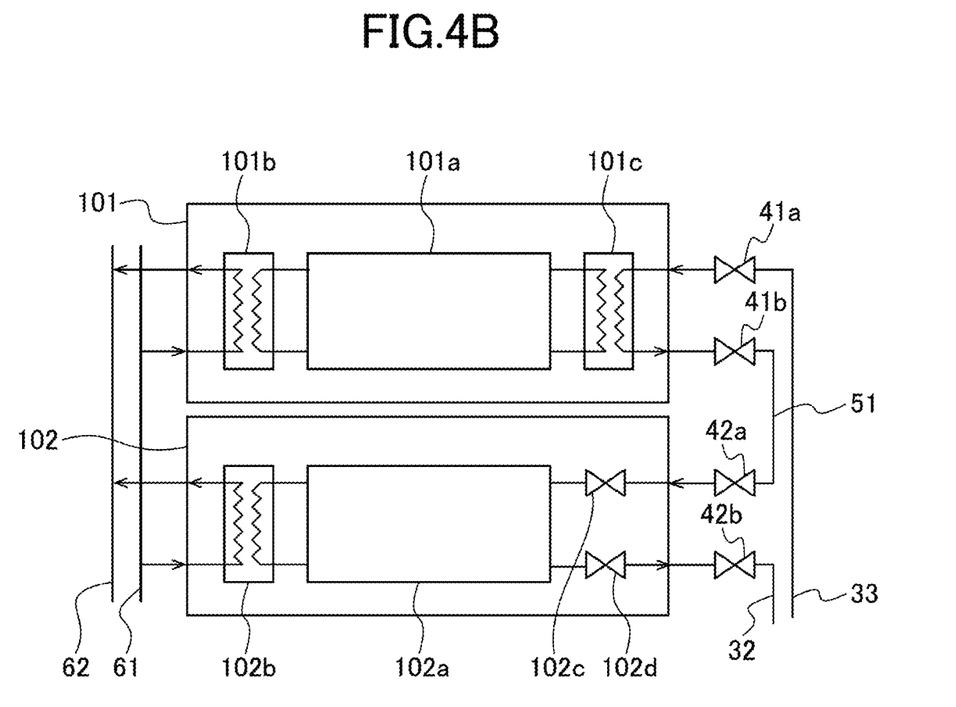
FIG. 4B is an example of a circuit diagram of a temperature control module in the test system according to the first embodiment.

FIG. 4A and FIG. 4B are drawings for explaining an example configuration of the temperature control module 100 in the test system 10 according to the first embodiment. FIG. 4A illustrates an example of an arrangement of the temperature control module 100 disposed in the cell tower 11 in the test system 10 according to the first embodiment. FIG. 4B is an example of a circuit diagram of the temperature control module 100 in the test system 10 according to the first embodiment.

As illustrated in FIG. 4A and FIG. 4B, in the first embodiment, a single cooler 101 and a single circulator 102 are provided as the temperature control module 100. Other cells 12 are the test chambers.

The piping 33 that extends from the other end of the flow path 31 of the stage 30 is connected to a heating medium inlet of the cooler 101 through a removable coupler 41a. A heating medium outlet of the cooler 101 is connected to one end of connecting piping 51 through a removable coupler 41b. The other end of the connecting piping 51 is connected to the heating medium inlet of the circulator 102 through a removable coupler 42a. A heating medium outlet of the circulator 102 is connected to the piping 32 that extends to one end of the flow path 31 of the stage 30 through a removable coupler 42b.

The cooler 101 includes, for example, a condenser 101b, an evaporator 101c, and a circuit section 101a. The circuit section 101a includes, for example, a compressor (which is not illustrated) and an expansion valve (which is not illustrated).

The compressor adiabatically compresses the refrigerant and discharges the high-temperature and high-pressure refrigerant. The condenser 101b is a heat exchanger that exchanges heat between the high-temperature and high-pressure refrigerant and the cooling water by supplying the high-temperature and high-pressure refrigerant from the compressor to the primary side, supplying the cooling water from cooling water passing piping 61 to the secondary side. With this configuration, the refrigerant releases heat to the cooling water. The cooling water that absorbs heat from the refrigerant flows to cooling water returning piping 62. The expansion valve reduces the pressure of the refrigerant whose heat is radiated by the condenser 101b and causes the refrigerant to be a low-temperature and low-pressure refrigerant. The evaporator 101c is a heat exchanger that exchanges heat between the low-temperature and low-pressure refrigerant and the heating medium by supplying the low-temperature and low-pressure refrigerant to the primary side from the expansion valve, supplying the heating medium to the secondary side from the heating medium inlet of the cooler 101. This allows the refrigerant to absorb heat from the heating medium. The cooled heating medium flows out from the heating medium outlet of the cooler 101.

Here, in the cooling water passing piping 61, the cooling water cooled by, for example, a cooling tower (which is not illustrated) flows. The cooling water returning piping 62 returns the cooling water that is heated to the cooling tower.

The circulator 102 includes a circuit section 102a, a heat exchanger 102b, and valves 102c and 102d. The circuit section 102a includes, for example, a tank (which is not illustrated) and a pump (which is not illustrated).

The heating medium flowing in the circulator 102 from the heating medium inlet of the circulator 102 is stored in the tank. The pump discharges the heating medium stored in the tank to flow out from the heating medium outlet of the circulator 102. The heat exchanger 102b is a heat exchanger that exchanges heat between a heat transfer medium and the cooling water by supplying the heat transfer medium for cooling the circuit section 102a to the primary side, and supplying the cooling water from the cooling water passing piping 61 to the secondary side. This allows the heat transfer medium to radiate heat to the cooling water. The cooling water that absorbs heat from the heat transfer medium flows to the cooling water returning piping 62.

Here, the valve 102c is provided near the heating medium inlet of the circulator 102, and the valve 102d is provided near the heating medium outlet of the circulator 102. The valves 102c and 102d are closed when the couplers 42a and 42b are removed for, for example, maintenance of the circulator 102 or replacement with another temperature control module 100.

As described above, in the test system 10 according to the first embodiment, the heating medium cooled by the cooler 101 can be supplied to the flow path 31 of the stage 30 through the circulator 102 and the piping 32. Additionally, the heating medium flowing out from the flow path 31 of the stage 30 is circulated through the piping 33 to the cooler 101. That is, in the test system 10 according to the first embodiment, a low temperature heating medium can be supplied to the flow path 31 of the stage 30 in the test chamber.

Second Embodiment

Figure 5A:
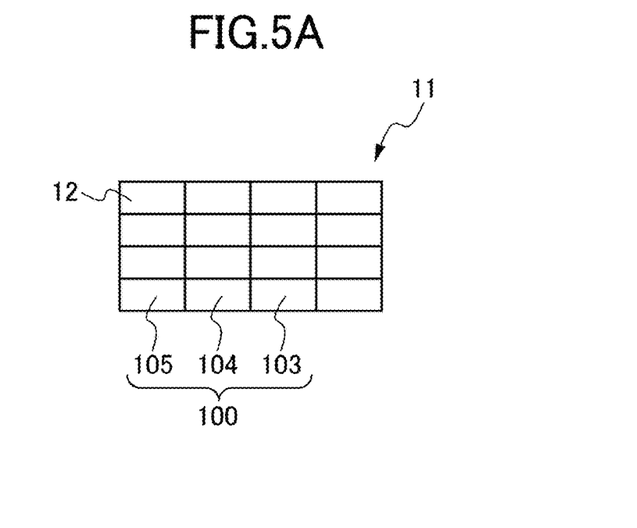
FIG. 5A is an example of an arrangement of the temperature control module 100 disposed in the cell tower in a test system according to a second embodiment.
Figure 5B:
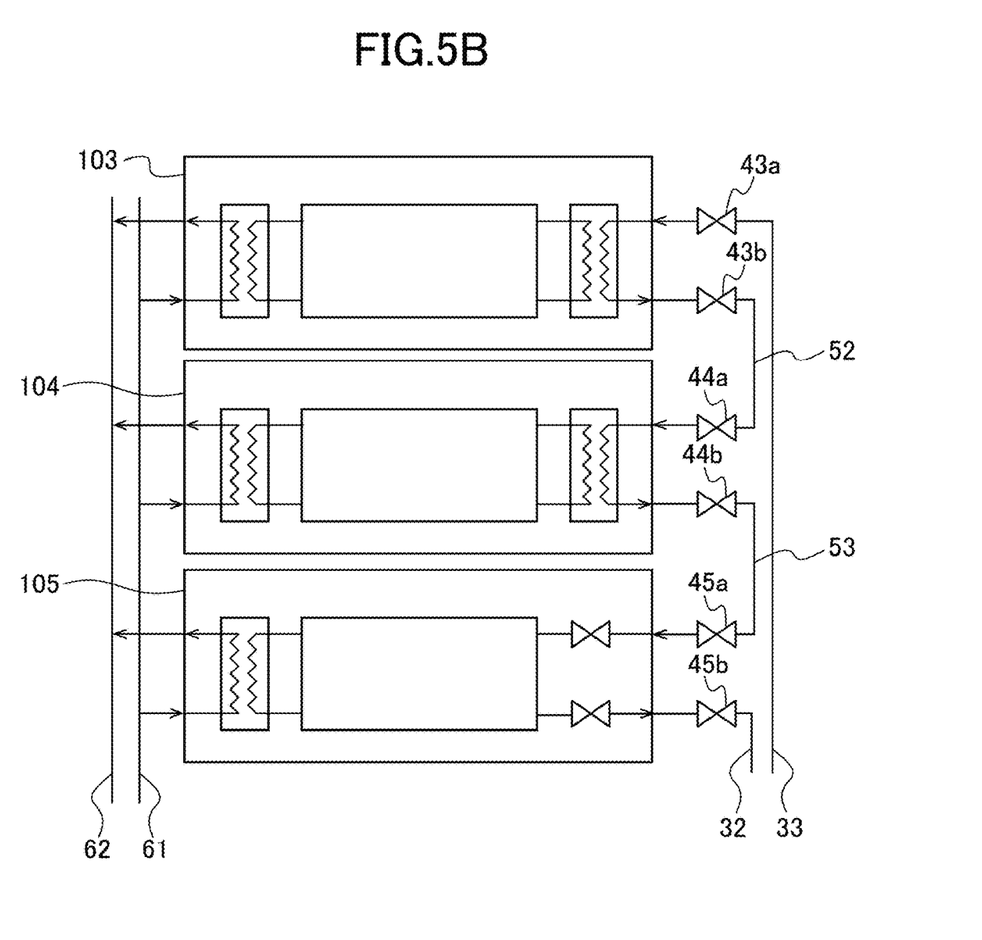
FIG. 5B is an example of a circuit diagram of a temperature control module in the test system according to the second embodiment.

FIG. 5A and FIG. 5B are drawings for explaining an example configuration of the temperature control module 100 in the test system 10 according to the second embodiment. FIG. 5A illustrates an example of an arrangement of the temperature control module 100 disposed in the cell tower 11 in the test system 10 according to the second embodiment. FIG. 5B illustrates an example of a circuit diagram of the temperature control module 100 in the test system 10 according to the second embodiment.

As illustrated in FIG. 5A and FIG. 5B, in the second embodiment, two coolers 103 and 104 and a single circulator 105 are provided as the temperature control module 100. Other cells 12 are the test chambers.

The piping 33 extending from the other end of the flow path 31 of the stage 30 is connected to a heating medium inlet of the cooler 103 through a removable coupler 43a. A heating medium outlet of the cooler 103 is connected to one end of a connecting piping 52 through a removable coupler 43b. The other end of the connecting piping 52 is connected to a heating medium inlet of the cooler 104 through a removable coupler 44a. Additionally, a heating medium outlet of the cooler 104 is connected to one end of the connecting piping 53 through a removable coupler 44b. The other end of the connecting piping 53 is connected to a heating medium inlet of the circulator 105 through a removable coupler 45a. A heating medium outlet of the circulator 105 is connected to the piping 32 that extends to one end of the flow path 31 of the stage 30 through the removable coupler 42b.

Here, the configuration of each of the coolers 103 and 104 is substantially the same as that of the cooler 101, the configuration of the circulator 105 is substantially the same as that of the circulator 102, and the overlapping description is omitted.

As described above, in the test system 10 according to the second embodiment, the heating medium cooled by the cooler 103 can be further cooled by the cooler 104 and supplied to the flow path 31 of the stage 30 through the circulator 105 and the piping 32. Additionally, the heating medium flowing out from the flow path 31 of the stage 30 circulates to the cooler 103 through the piping 33. That is, in the test system 10 according to the second embodiment, an extremely low temperature heating medium can be supplied to the flow path 31 of the stage 30 in the test chamber.

Third Embodiment

Figure 6A:
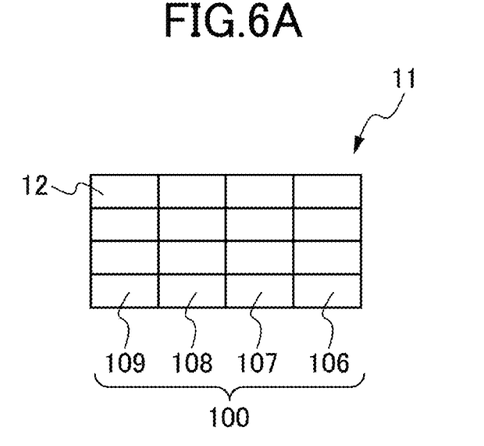
FIG. 6A is an example of an arrangement of the temperature control module 100 disposed in the cell tower in a test system according to a third embodiment.
Figure 6B:
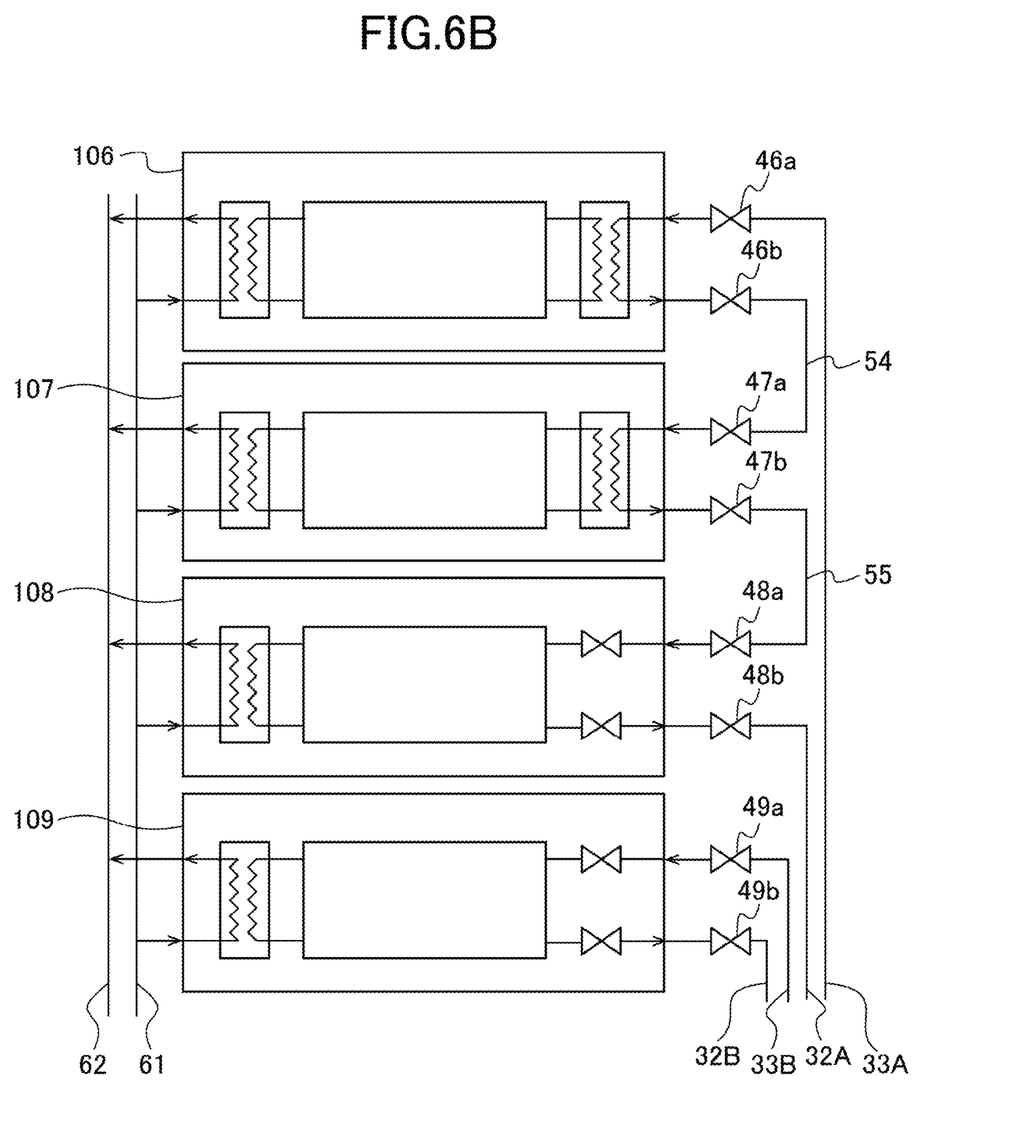
FIG. 6B is an example of a circuit diagram of the temperature control module in the test system according to the third embodiment.

FIG. 6A and FIG. 6B are drawings for explaining an example configuration of the temperature control module 100 in the test system 10 according to the third embodiment. FIG. 6A illustrates an example of an arrangement of the temperature control module 100 disposed in the cell tower 11 in the test system 10 according to the third embodiment. FIG. 6B illustrates an example of a circuit diagram of the temperature control module 100 in the test system 10 according to the third embodiment.

As illustrated in FIG. 6A and FIG. 6B, in the third embodiment, heating mediums are output from two systems. A first system includes two coolers 106 and 107 and a single circulator 108 as the temperature control module 100. A second system includes a single circulator 109 as the temperature control module 100. Other cells 12 are the test chambers.

In the first system, piping 33A that extends from the other end of the flow path 31 of the stage 30 is connected to a heating medium inlet of the cooler 106 through a removable coupler 46a. A heating medium outlet of the cooler 106 is connected to one end of the connecting piping 54 through a removable coupler 46b. The other end of the connecting piping 54 is connected to a heating medium inlet of the cooler 107 through a removable coupler 47a. Additionally, a heating medium outlet of the cooler 107 is connected to one end of the connecting piping 55 through a removable coupler 47b. The other end of the connecting piping 55 is connected to a heating medium inlet of the circulator 108 through a removable coupler 48a. A heating medium outlet of the circulator 108 is connected to piping 32A that extends to one end of the flow path 31 of the stage 30 through a removable coupler 48b.

In the second system, piping 33B that extends from the other end of the flow path 31 of the stage 30 is connected to a heating medium inlet of the circulator 109 through a removable coupler 49a. A heating medium outlet of the circulator 109 is connected to piping 32B that extends to one end of the flow path 31 of the stage 30 through a removable coupler 49b.

Here, the configuration of each of the coolers 106 and 107 is substantially the same as that of the cooler 101, the configuration of the circulator 108 is substantially the same as that of the circulator 102, and the overlapping description is omitted.

The configuration of the circulator 108 is substantially the same as that of the circulator 102 and the overlapping description is omitted. Additionally, the circulator 108 may include a heater (which is not illustrated) that heats the heating medium. For example, the heater is provided in a tank that stores the heating medium to heat the heating medium in the tank. This allows the circulator 108 to cause the heated heating medium to flow out from the heating medium outlet of the circulator 102.

As described above, in the test system 10 according to the third embodiment, the heating medium cooled by the cooler 106 can be further cooled by the cooler 107 and supplied to the flow path 31 of the stage 30 through the circulator 108 and the piping 32A. Additionally, the heating medium flowing out from the flow path 31 of the stage 30 circulates to the cooler 106 through the piping 33A. Additionally, the heating medium heated in the circulator 109 can be supplied to the flow path 31 of the stage 30 through the piping 32B. The heating medium that flows out from the flow path 31 of the stage 30 also circulates to the circulator 109 through the piping 33B. That is, in the test system 10 according to the third embodiment, a heating medium having a different temperature can be supplied to the test chamber.

For example, among the multiple cells 12, the extremely low temperature heating medium can be supplied to the flow paths 31 of the stages 30 in the test chambers provided in the cells 12d at the upper stage, and the heated heating medium can be supplied to the flow paths 31 of the stages 30 in the test chambers provided in the cells 12b and 12c at the middle stages. This allows the test in different temperature ranges to be performed.

As described above, in the test system 10 according to the present embodiment, as illustrated in FIGS. 4 to 6, the temperature control module 100, such as the cooler and the circulator, can be disposed in the cell 12d at the lowermost stage of the cell tower 11.

Here, in a case of a test system in which the temperature control module, such as the cooler and the circulator, is disposed outside of the cell tower 11, a test system for a low temperature test and a test system for a high temperature test differ in the number of the coolers and the circulators depending on the temperature range to be tested, so that the footprints of the entire test systems are different. Thus, it is necessary to determine the specification of the test system at the time of investment.

Additionally, in the case of the test system in which the temperature control module, such as the cooler and the circulator, is disposed outside of the cell tower 11, if the number of the coolers and the circulators increases or decreases due to a change in the specification, the footprint of the entire test system also increases or decreases. Thus, a major change of a layout in a chamber in which the test system is installed may be required.

With respect to the above, in the test system 10 according to the present embodiment, the footprint of the test system 10 can be maintained even if the specification of the test system 10 is different. Additionally, even if the test system 10 specification is changed, the footprint of the test system 10 can be maintained, thereby preventing a significant change of the layout in the chamber in which the test system 10 is installed from being required.

Additionally, as illustrated in FIG. 3A and FIG. 3B, the temperature control module 100, such as the cooler and the circulator, can be drawn in the same direction as the test head 20 and maintained. This allows the temperature control module 100 to be drawn in the maintenance area 90 that is provided to maintain the test head 20 and to be easily maintained. Additionally, the increase in area occupied by the entire test system 10 that includes the footprint of the test system 10 and the maintenance area 90 can be suppressed. Additionally, when the specification of the test system 10 is changed, the temperature control module 100 can be drawn to the maintenance area 90 and replaced with another temperature control module 100.

Additionally, the temperature control module 100 is divided into the cooler and the circulator. This allows various specifications of the test system 10 to be supported by changing a combination of the cooler and the circulator, as illustrated in the examples of FIGS. 4 to 6.

Additionally, by disposing the temperature control module 100 in the cell 12a at the lowermost stage among the multiple cells 12 of the cell tower 11, even if the heating medium, the cooling water, or the like leaks from the temperature control module 100, the influence to the test chamber can be suppressed.

Although the test system 10 has been described above, the present disclosure is not limited to the above-described embodiments and the like, and various modifications and improvements can be made within the scope of the subject matter of the present disclosure as claimed.

The cells 12 of the cell tower 11 have been described as having the same shape, but are not limited thereto. For example, the shape may be different between the cell 12a at the lowermost stage in which the temperature control module 100 (the cooler and the circulator) is installed and the cells 12b to 12d that serve as the test chamber. For example, the cell 12a may be equal in size to two cells in comparison with the cells 12b to 12d that serve as the test chamber.

This application is based on and claims priority to Japanese Patent Application No. 2019-164007, filed Sep. 9, 2019, and the entire contents of which are incorporated herein by reference.

DESCRIPTION OF REFERENCE SYMBOLS 10 test system
11 cell tower
12, 12a to 12d cells
15 loader
20 test head
29 maintenance opening
30 stage
31 flow path
32, 33 piping
51 to 55 connecting piping (connecting part)
61 cooling water passing pipe
62 cooling water return pipe
90 maintenance area
100 temperature control module (heating medium supply)
101, 103, 104, 106, 107 cooler (heating medium supply)
101a circuit
101b condenser
101c evaporator
102, 105, 108, 109 circulator (heating medium supply)
102a circuit
102b heat exchanger
W wafer

What is claimed is:

1. A test system comprising:
    a plurality of test chambers, each test chamber of the plurality of test chambers including a test head used when a substrate on a stage is tested:
    a heating medium supply configured to supply a heating medium to the stage; and
    a cell tower including a plurality of cells that are partitioned,
    wherein the heating medium supply is disposed in a cell at a lowermost stage among the plurality of cells,
    wherein the plurality of test chambers are disposed in cells at stages higher than the cell in which the heating medium supply is disposed, and
    wherein the heating medium supply includes a circulator configured to circulate the heating medium, the circulator being disposed in the cell in which the heating medium supply is disposed.

2. The test system as claimed in claim 1, wherein the heating medium supply includes a cooler configured to cool the heating medium, the cooler being disposed in a cell different from the cell in which the circulator is disposed.

3. The test system as claimed in claim 2, further comprising a connecting part, the connecting part connecting the circulator and the cooler such that the heating medium can flow.

4. The test system as claimed in claim 2, wherein the circulator and the cooler have a same shape.

5. A test system comprising:
    a plurality of test chambers, each test chamber of the plurality of test chambers including a test head used when a substrate on a stage is tested:
    a heating medium supply configured to supply a heating medium to the stage; and
    a cell tower including a plurality of cells that are partitioned,
    wherein the heating medium supply is disposed in a cell at a lowermost stage among the plurality of cells,
    wherein the plurality of test chambers are disposed in cells at stages higher than the cell in which the heating medium supply is disposed,
    wherein the test head is configured such that the test head can be drawn in a maintenance area from a corresponding test chamber among the plurality of test chambers, and
    wherein the heating medium supply is configured such that the heating medium supply can be drawn in the maintenance area from the cell of the cell tower.

6. The test system as claimed in claim 5, further comprising a loader configured to transfer the substrate, the loader being disposed adjacent to the cell tower, wherein the cell tower is disposed between the loader and the maintenance area.

* * * * *